US009006692B2

(12) United States Patent
Todorov et al.

(10) Patent No.: US 9,006,692 B2
(45) Date of Patent: *Apr. 14, 2015

(54) APPARATUS AND TECHNIQUES FOR CONTROLLING ION IMPLANTATION UNIFORMITY

(71) Applicant: Varian Semiconductor Equipment Associates, Inc., Gloucester, MA (US)

(72) Inventors: Stanislav S. Todorov, Topsfield, MA (US); George M. Gammel, Marblehead, MA (US); Richard Allen Sprenkle, South Hamilton, MA (US); Norman E. Hussey, Middleton, MA (US); Frank Sinclair, Boston, MA (US); Shengwu Chang, South Hamilton, MA (US); Joseph C. Olson, Beverly, MA (US); David Roger Timberlake, Lexington, MA (US); Kurt T. Decker-Lucke, Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/037,218

(22) Filed: Sep. 25, 2013

(65) Prior Publication Data

US 2014/0326179 A1 Nov. 6, 2014

Related U.S. Application Data

(60) Provisional application No. 61/819,080, filed on May 3, 2013.

(51) Int. Cl.
*G21K 5/04* (2006.01)
*C23C 14/54* (2006.01)
*G21K 5/00* (2006.01)

(52) U.S. Cl.
CPC .. *C23C 14/54* (2013.01); *G21K 5/00* (2013.01)

(58) Field of Classification Search
CPC ......... H01J 37/30; H01J 37/36; H01J 37/317; H01J 37/3171; H01J 37/3172; H01J 2237/31; H01J 2237/31701; H01J 2237/3365
USPC ................. 250/492.1, 492.2, 492.22, 492.23, 250/492.3
See application file for complete search history.

(56) References Cited

U.S. PATENT DOCUMENTS

| 6,323,497 B1 | 11/2001 | Walther |
| 7,453,070 B2 * | 11/2008 | Gupta et al. .................. 250/397 |
| 7,663,125 B2 * | 2/2010 | Callahan et al. ......... 250/492.21 |

(Continued)

OTHER PUBLICATIONS

International Search Report and Written Opinion mailed Sep. 9, 2014 for PCT Application, PCT/US2014/036549 Filed May 2, 2014.

(Continued)

*Primary Examiner* — Nicole Ippolito

(57) ABSTRACT

A system to control an ion beam in an ion implanter includes a detector to perform a plurality of beam current measurements of the ion beam along a first direction perpendicular to a direction of propagation of the ion beam. The system also includes an analysis component to determine a beam current profile based upon the plurality of beam current measurements, the beam current profile comprising a variation of beam current along the first direction; and an adjustment component to adjust a height of the ion beam along the first direction when the beam current profile indicates the beam height is below a threshold.

14 Claims, 6 Drawing Sheets

(56) References Cited

U.S. PATENT DOCUMENTS

| | | | |
|---|---|---|---|
| 2003/0042427 A1* | 3/2003 | Sullivan et al. | 250/397 |
| 2005/0269527 A1 | 12/2005 | Murrell et al. | |
| 2008/0061250 A1 | 3/2008 | Perel et al. | |
| 2008/0073550 A1* | 3/2008 | Gupta et al. | 250/398 |
| 2008/0073584 A1 | 3/2008 | Callahan et al. | |
| 2009/0242808 A1 | 10/2009 | Evans | |
| 2009/0272918 A1 | 11/2009 | Satoh | |
| 2011/0042578 A1 | 2/2011 | Murrell et al. | |

OTHER PUBLICATIONS

International Search Report and Written Opinion mailed Sep. 9, 2014 for PCT Application, PCT/US2014/036551 Filed May 2, 2014.

* cited by examiner

APPARATUS AND TECHNIQUES FOR CONTROLLING ION IMPLANTATION UNIFORMITY

This application claims priority to U.S. Provisional Patent application 61/819,080 filed May 3, 2013.

FIELD

This invention relates to an ion implantation apparatus, more particularly, to ion beam uniformity control in ion implantation apparatus.

BACKGROUND

Present day manufacturing for semiconductor electronics, solar cells, and other technology relies on ion implanter systems for doping or otherwise modifying silicon and other types of substrates. A typical ion implanter system performs the doping by generating an ion beam and steering it into a substrate so that the ions come to rest beneath the surface. In many applications, ion beams having a defined shape and ion beam area such as a spot beam or ribbon beam are scanned over a substrate to implant a species into a substrate area that is larger than the ion beam area. Alternatively, a substrate may be scanned with respect to a stationary beam or both substrate and beam may be scanned with respect to one another. In any of these circumstances many applications require that a substrate be implanted uniformly over a large portion of the substrate.

One type of non-uniformity that may be produced by an ion beam is termed "micrononuniformity" and refers to the presence of regular patterns of varying ion dose on a substrate. Such patterns may appear, for example as stripes of varying ion dose that are observed when a substrate is scanned along a particular direction. Other non-uniformity may result from high frequency variation in ion beam properties that are also associated with sharp changes in beam current density within an ion beam, such as "hot spots." Typically such non-uniformities may not be detected until after substrates have been processed. Moreover, depending upon the requirements of a given application, ion dose non-uniformity as little as a few tenths of one percent or even less may be unacceptable. An undetected micrononuniformity may therefore result in the inadvertent production of unusable product. It is with respect to these and other considerations that the present improvements have been needed.

SUMMARY

Embodiments are related to apparatus and methods for controlling ion beams. In one embodiment, a system to control an ion beam in an ion implanter includes a detector to perform a plurality of beam current measurements of the ion beam along a first direction perpendicular to a direction of propagation of the ion beam. The system also includes an analysis component to determine a beam current profile based upon the plurality of beam current measurements, the beam current profile comprising a variation of beam current along the first direction; and an adjustment component to adjust a height of the ion beam along the first direction when the beam current profile indicates the beam height is below a threshold.

In another embodiment an ion implanter includes an ion source to generate an ion beam; and a detector to perform a plurality of ion beam current measurements of the ion beam along a first direction perpendicular to a direction of propagation of the ion beam. The ion implanter also includes a controller including at least one computer-readable storage medium comprising instructions that, when executed, cause the controller to: determine a beam current profile based upon the plurality of ion beam current measurements, the beam current profile comprising a variation of ion beam current along the first direction; calculate a beam height along the first direction based upon the beam current profile; and send instructions to perform a parameter adjustment to increase the ion beam height along the first direction when the calculated beam height is below a threshold.

DETAILED DESCRIPTION

The embodiments described herein provide an apparatus for treating or controlling an ion beam in an ion implanter. Examples of an ion implanter include a beamline ion implanter. The ion implanters covered by the present embodiments include those that generate "spot ion beams" that have a cross-section that has the general shape of a circle or ellipse and those that generate "ribbon ion beams" or "ribbon beams" having an elongated cross-section. Those skilled in the art may readily appreciate that the cross sectional shape of a spot beam may also have an irregular shape. In the present embodiments, a system is provided to dynamically control ion beam uniformity in an ion implantation system (ion implanter). The system (also referred to herein as a "control system") includes a detector (or detector system) that is employed to measure or sample ion beam current in an ion beam, an analysis component that determines a non-uniformity in the ion beam based upon the sampled ion beam current, and an adjustment component that adjusts a parameter of the ion implanter as a result of the determined non-uniformity. The adjustment to the ion implanter is performed in a dynamic manner, that is, parameters that control ion beam properties are dynamically adjusted while the ion beam is directed through the ion implanter and measured. This process may be performed in a closed loop that attempts in an iterative fashion to adjust ion beam properties through adjustment to a parameter of the ion implantation apparatus until the sampled ion beam current indicates that the non-uniformity has receded below a threshold value.

The present embodiments thus provide real-time detection of potential causes for micrononuniformity that may be produced on a substrate such as a semiconductor wafer. This provides an advantage over present approaches which only detect micrononuniformity after completion of substrate processing, which may take place after complete devices are fabricated on a batch or batches of substrates, or after extensive off-line measurements are conducted after an implantation process is complete. The real-time detection of conditions within an ion implanter responsible for producing micrononuniformity patterns in a substrate facilitate automated closed loop control for adjusting or "tuning" an ion beam. This produces a more optimal setup process and/or the ability to readily detect problems with various hardware components of the ion implanter, including improper rebuild after preventive maintenance operations.

Figure 1A:
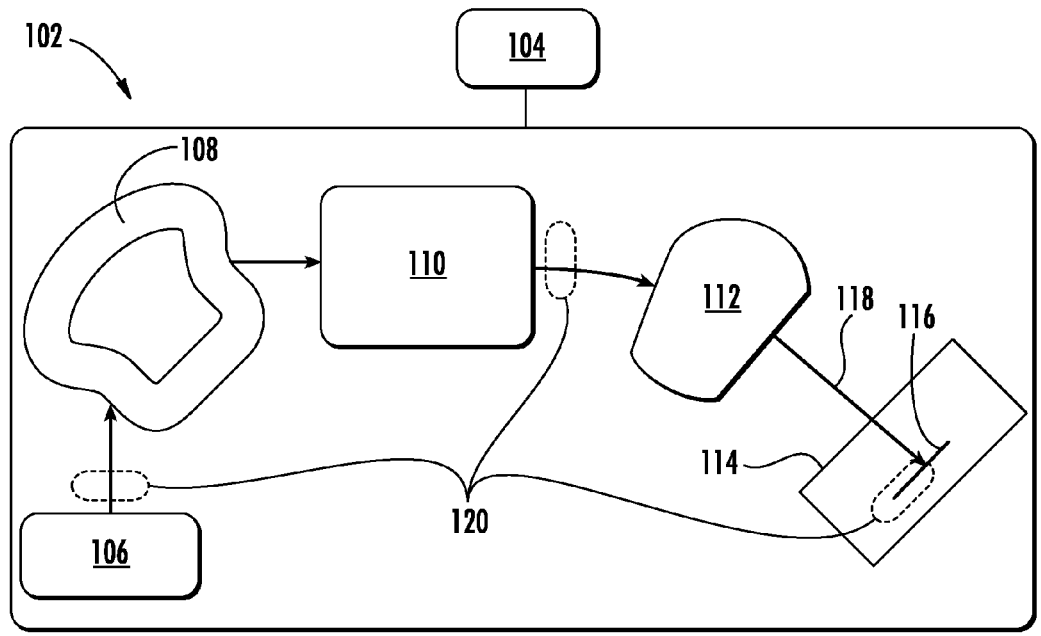
FIG. 1A depicts an exemplary ion implanter.

FIG. 1A depicts the architecture 100 of a beamline ion implanter 102 and control system 104 that is used to dynamically adjust hardware or components of the beamline ion implanter consistent with the present embodiments. The beamline ion implanter 102 may include various conventional components including an ion source 106, magnetic analyzer 108, corrector magnet 112 and substrate stage 114. In various embodiments the beamline ion implanter 102 generates the ion beam 118 as a spot type ion beam or ribbon beam. The beamline ion implanter 102 may include various additional beam processing components that may shape, focus, accelerate, decelerate, and bend the ion beam 118 as it propagates from the ion source 106 to substrate 116. For example, an electrostatic scanner 110 may be provided to scan the ion beam 118 with respect to the substrate 116.

The ion implanter 102 also includes one or more beam current detectors 120, which may be Faraday detectors in some embodiments. The detectors 120 may be positioned at various locations within the beamline ion implanter 102 and may be stationary or movable in various embodiments. The current output of key power supplies providing power to certain implanter optical elements may also be monitored; i.e. power supplies may also serve as "detectors". As further illustrated in FIG. 1B the detectors 120 may form part of the control system 104 that dynamically adjusts a parameter or parameters of the ion implanter 102 to reduce variation in the ion beam 118. The adjusted parameter(s) are associated with one or more components of the ion implanter 102 including, in addition to those components depicted in FIG. 1A, any ion beam processing element such as a focusing element, an ion beam lens, a movable aperture, a beam steering component. The embodiments are not limited in this context.

Figure 1B:
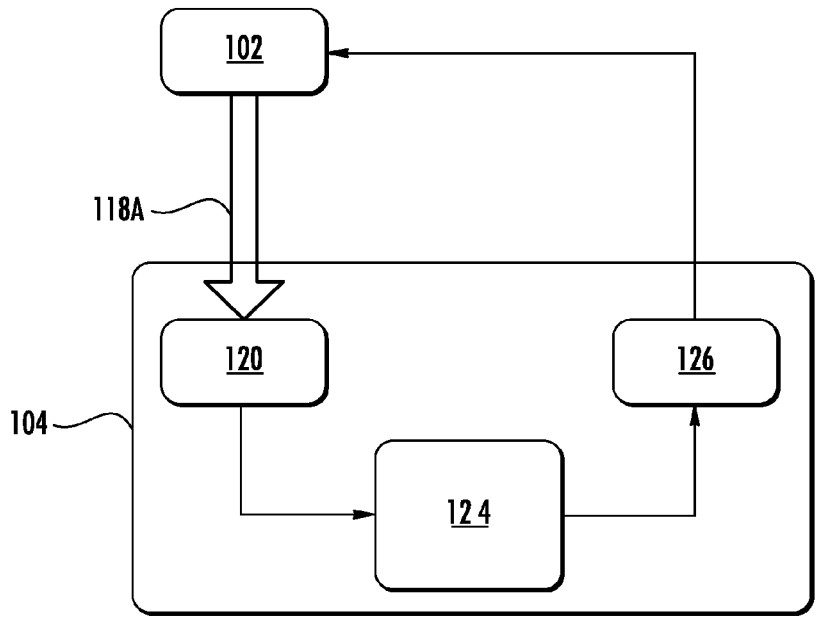
FIG. 1B depicts an exemplary control system.

Turning now to FIG. 1B, there are shown details of the control system 104 consistent with various embodiments. As detailed below the control system generally includes a detector that is configured to perform one or more beam current measurements of an ion beam at a respective one or more instances. The control system also includes an analysis component used to determine properties of the ion beam based upon the one or more beam current measurements. The control system also includes an adjustment component to adjust a parameter of the ion implanter to reduce nonuniformity that may be produced by variation in properties of an ion beam. In various implementations the control system may adjust parameters to increase beam size for example of an ion beam based on results of the analysis component. This may be particularly useful to avoid the effects of high frequency variation in an ion beam that may be generally undetected.

Such high frequency variation may take place at frequencies of 10 kHz or higher, and may induce nonuniformities in implantation dose across a substrate particularly in situations in which ion beam size is below a threshold and/or a gradient in ion beam current is greater than another threshold. The control system 104, and in particular, the analysis component and beam adjustment component, are configured to dynamically reduce ion beam variation while the ion beam is generated in the ion implantation apparatus. In particular, dynamic adjustments to beam height and/or gradient in ion beam current along a first direction may be performed to reduce non-uniformities in ion dose that may otherwise result when a substrate is scanned along the first direction, that is, along the direction of beam height.

In the embodiment pictured, the control system 104 is configured to receive a beam portion 118A of the ion beam 118 in order to measure and determine ion beam current and variation in ion beam current and to adjust parameters of the ion implanter 102 as appropriate based upon the determined variation in ion beam current. The control system 104 includes the detector(s) 120, an analysis component 124, and beam adjustment component 126. In various embodiments, the beam portion 118A received by the detector 120 may be the entire ion beam 118 or only a portion that is less than the entire ion beam 118.

The control system 104 and components therein may comprise various hardware elements, software elements, or a combination of both. Examples of hardware elements may include devices, components, processors, microprocessors, microcontrollers, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

In the discussion to follow various embodiments are disclosed for detecting ion beam "height" along a particular direction as well as the change in beam current as a function of position along that direction, which is referred to as "beam current profile." The measurement of these features may then be employed to determine when adjustments to ion implantation parameters are to be performed.

In some examples, beam current in an ion beam may be continuously measured and beam current data from the ion beam analyzed in a continuous, intermittent or periodic fashion.

As detailed further below, the control system 104 affords the ability to reduce ion beam variation in real-time so that potential problems such as micrononuniformity in ion dose over a substrate that result from ion beam variation during substrate processing can be prevented or rapidly eliminated.

In particular, in various embodiments, the control system 104 acts to identify and reduce or eliminate variation in beam current in an ion beam that may be related to beam size, beam shape, and variation in beam properties including high frequency variation at frequencies higher than several thousand Hz.

Figure 2:
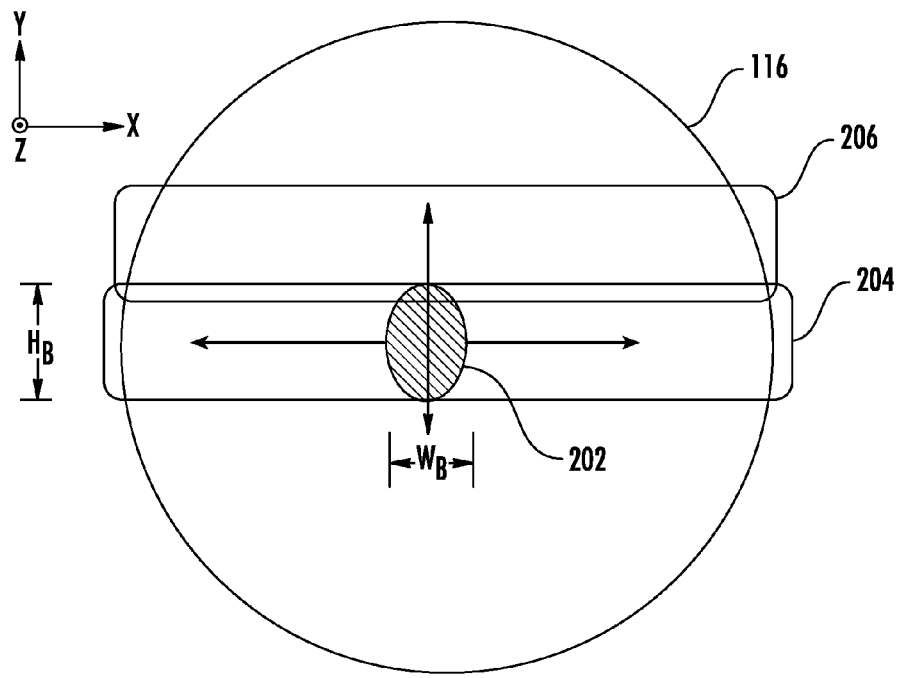
FIG. 2 depicts a plan view showing results of substrate processing under a first set of ion beam conditions.

FIG. 2 shows a top plan view of ion implantation of a substrate 116 looking downstream in a direction of travel of the ion beam 202. In this perspective the ion beam 202 has a shape of a spot beam as shown by its cross-section that impacts the substrate 116 at any given instance. The ion beam 202 may be scanned back and forth generally from left to right of the substrate as viewed in the FIG. 2. In some cases, scanning may be performed in a direction parallel to the X-axis (also referred to as "X-direction") of the Cartesian coordinate system shown. However, other scanning patterns are possible. At the same time, the substrate 116 may be driven by the substrate stage 114 along a direction parallel to the Y-axis. The scanning of the ion beam generally from right to left or vice versa may be combined with the movement of the substrate stage along the Y-direction to allow the ion beam 202 to implant into the entire substrate 116 or as large a portion of the substrate 116 as desired. The Z-direction represents the direction of propagation of the ion beam 202 at the substrate 116.

As further shown in FIG. 2, the ion beam 202 may be characterized by a beam height $H_B$ along a direction parallel to the Y-axis and by a beam width $W_B$ along a direction parallel to the X-axis. The beam height $H_B$ thus generally refers to the dimensions of the ion beam 202 in a direction parallel to the direction of substrate movement. When the ion beam 202 is scanned along the direction parallel to the X-axis while the substrate 116 is driven along the direction parallel to the Y-axis, the ion beam 202 may generate a series of implantation zones such as zones 204, 206, which may overlap according to a designed pattern to generate a uniform implantation of ions into the substrate 116.

Figure 3A:
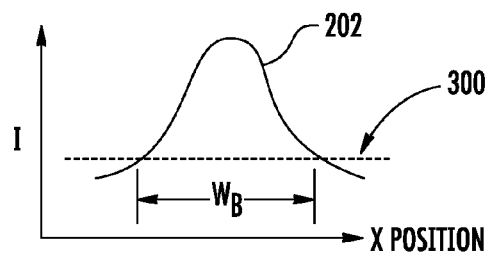
FIG. 3A depicts an exemplary beam current profile of an ion beam produced under a first set of conditions along a first direction that is generally perpendicular to a direction of travel of the ion beam.
Figure 3B:
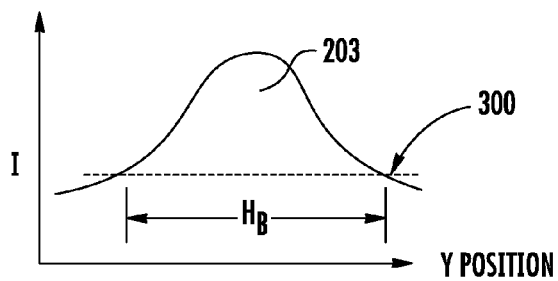
FIG. 3B depicts an exemplary beam current profile of the ion beam of FIG. 3A along a second direction perpendicular to the first direction and generally perpendicular to a direction of travel of the ion beam.

FIGS. 3A and 3B illustrate the variation of ion beam current, that is, the beam current profile 203 for the ion beam 202. The FIGS. 3A and 3B plot the beam current (I) as a function of position in X- and Y-directions, to provide further details of the characteristics of the ion beam 202. As illustrated the ion beam current as a function of position may have a generally Gaussian shape in these two mutually perpendicular directions. The parameters beam width $W_B$ beam height $H_B$ may be defined based upon the size of the ion beam 202 that exceeds a given current level 300. In order to generate a pattern of uniform ion implantation, control of the shape and size of the ion beam 116, including control of beam width $W_B$ beam height $H_B$ may be important. For example, the change in the value of current I as a function of position ideally may be gradual.

Figure 4A:
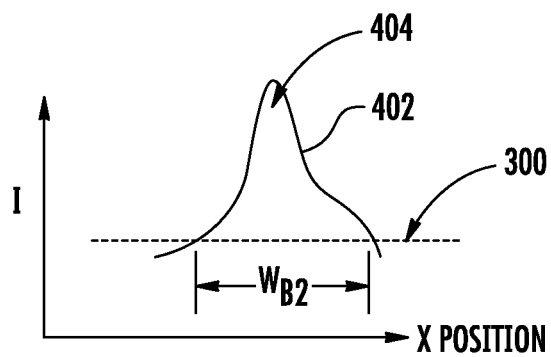
FIG. 4A depicts an exemplary beam current profile of an ion beam produced under a second set of conditions along a first direction that is generally perpendicular to a direction of travel of the ion beam.
Figure 4B:
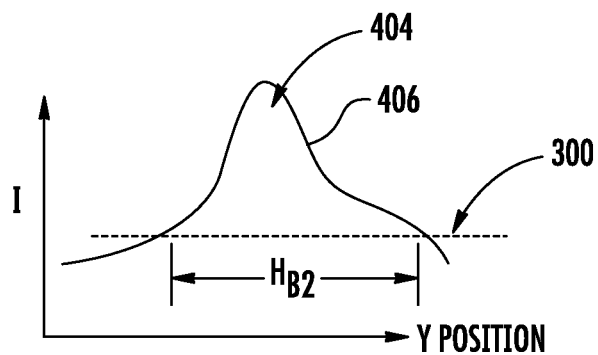
FIG. 4B depicts an exemplary beam current profile of the ion beam of FIG. 4A along a second direction perpendicular to the first direction and generally perpendicular to a direction of travel of the ion beam.

Because the ion beam 202 may be subject to multiple different beamline components as it propagates toward the substrate 116, the ion beam 202 may experience various perturbations that cause the beam characteristics to change or to deviate from desired characteristics when components of an ion implanter are initially activated. In particular, the beam size and beam current profile may vary and may depart from a desired size and beam current profile. FIGS. 4A and 4B illustrate another beam current profile that plots the ion beam current (I) as a function of position in X- and Y-directions for another ion beam that has different characteristics from the ion beam 202. As illustrated the ion beam current profiles 402, 406 have a non-Gaussian shape in both respective X- and Y-directions, and exhibits values of beam width $W_{B2}$ beam height $H_{B2}$ that differ from the counterparts $W_B$ and $H_B$ of ion beam 202. In the particular example illustrated in FIG. 4B, $H_{B2}$ is less than $H_B$ and may be less than a desired value to achieve uniform ion implantation. In addition, the beam current density profile as represented by the change in I as a function of position along the Y direction, may exhibit a slope that is greater than desired. For example, in the center region of the ion beam, a sharply peaked current is evident, about which center region the current rapidly diminishes with changes in position along the Y-direction. A similar characteristic may be evident in the X-direction as shown in FIG. 4A. This type of sharp gradient in the beam current density profile may be especially problematic for maintaining uniform ion implantation as the ion beam is scanned back and forth along the X-direction while the substrate 116 is moved along the Y-direction.

In particular, the features of an ion beam whose profile is illustrated in FIGS. 4A and 4B may be characteristic of "hotspots" such as region 404, in which beam current changes rapidly as a function of position and in which the beam current density per unit area is excessive or greater than a desired value. When such a beam is scanned over a substrate it may be difficult of impossible to provide uniform ion dose over an entire area of the substrate to be implanted. This may be particularly problematic in the case of high frequency variation in ion beam characteristics that cannot be typically detected in real time.

Figure 5A:
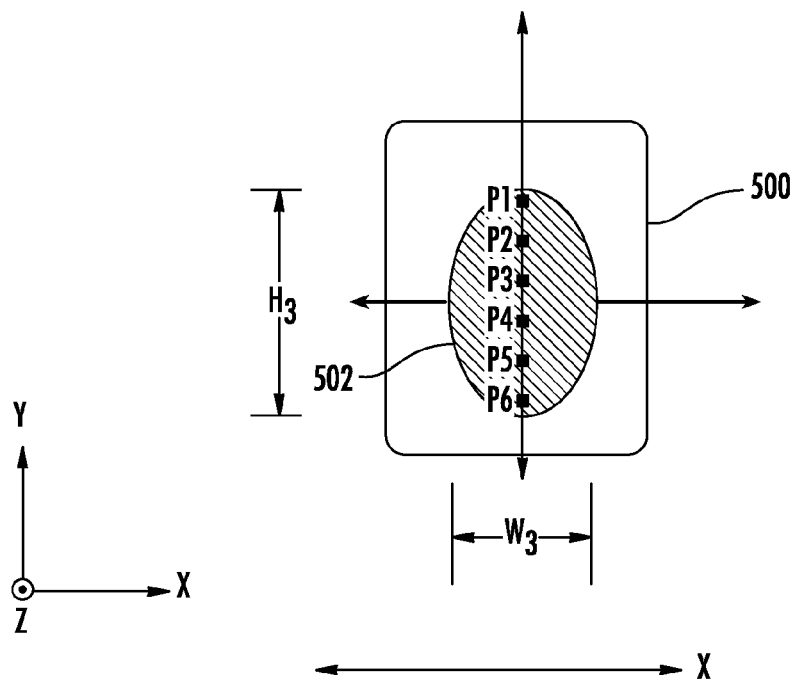
FIG. 5A depicts a plan view of an ion beam and exemplary beam current detector.

In accordance with the present embodiments, a detection system and techniques are provided to perform a closed loop adjustment to an ion beam to reduce or eliminate implantation dose non-uniformities that may be triggered when beam height and/or hot spot problems are present. FIG. 5A depicts a plan view of an exemplary detector 500 and an ion 502 beam that is measured by the detector. In this case the ion beam 502 is shown in cross-section viewing downstream toward the substrate (not shown). In different implementations, the detector 500 is arranged to intercept all of the ion beam 502 or a portion of the ion beam 502 that is less than the entire ion beam. As illustrated in FIG. 5A, the ion beam 502 may be a spot beam as generally described above. The ion beam 502 may be rastered back and forth, for example, along a direction parallel to the X-axis. A substrate stage may move a substrate with respect to the ion beam 502 along a direction parallel to the Y-axis. To ensure uniform implantation dose within a substrate the detector 500 is configured to measure parameters of the ion beam 502, including beam height (represented by $H_3$ in FIG. 5A) and beam current density gradients.

In various embodiments, the detector 500 is configured to perform multiple ion beam current measurements simultaneously. For example, the detector 500 may be configured as a multi-pixel profiler in which separate current measurements are performed at a plurality of different points along an ion beam. In one example, for purposes of illustration current is separately detected at a series of points P1 to P6 that are distributed at different locations along a direction parallel to the Y-axis, or the "beam height" direction in this example. Thus, at a given instance or over a given interval, a series of six different ion beam current measurements may be measured corresponding to different locations P1 to P6. This type of measurement may produce a beam current profile that registers ion current for different locations along the Y-axis. Such a measurement may then be used to extract beam height ($H_3$) information as well as ion beam current density gradient information in order to determine whether adjustments to ion implanter parameters are to be performed to adjust the ion beam properties. Of course, in other implementations many more separate beam current measurements may be taken along a given direction to improve accuracy of beam height determination.

Figure 5B:
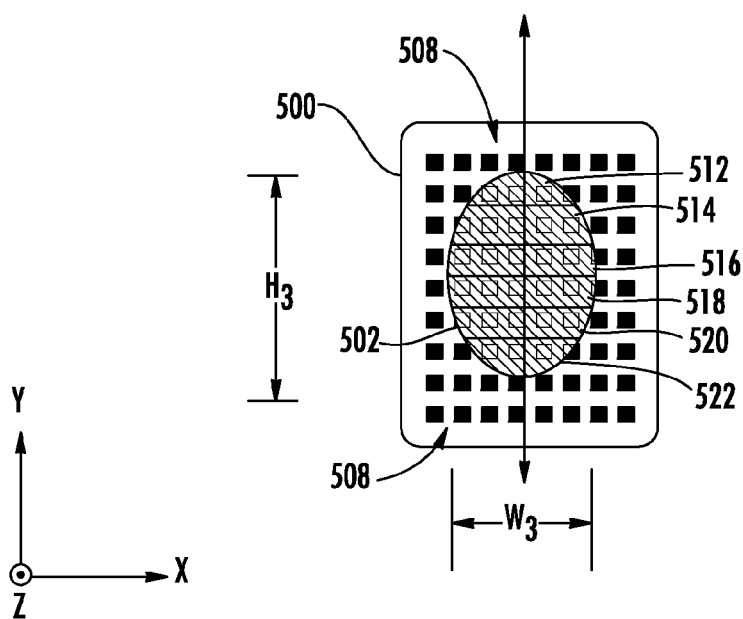
FIG. 5B depicts a plan view of one variant of the beam current detector of FIG. 5A.

FIG. 5B depicts one variant of the detector 500 in which a two dimensional array of detector pixels 508 are each arranged to intercept small portions of the ion beam 502. In one implementation, a separate beam current may be sampled within the separate regions 512 522 shown, each of which may record beam current from multiple pixels. Each region 512-522 may correspond to a different coordinate with respect to the Y-axis, such as the aforementioned points P1-P6. In this manner, beam current profiling along the Y-axis may be performed to sample over the entire cross-section of the ion beam 502. In further embodiments, other known detector configurations for measuring beam height and/or beam current profiles along a desired direction are possible.

Consistent with the present embodiments, once beam height and/or beam current profile information is collected, the ion beam properties may be adjusted in a closed loop tuning process. For example, the detector 500 may be located at one or more of the locations of the detectors 120 of FIG. 1A. Depending upon the location of the detector 500 the analysis component 124 may determine appropriate parameters of an ion implanter to be changed by the adjustment component 126. For example, in embodiments in which the adjustment component 126 is included in a controller, the controller may be coupled to multiple beamline components including power supplies for different components, movable apertures, and so forth.

The controller may additionally be preconfigured with selected parameters that may be adjusted in the various components to attempt to increase the ion beam height as necessary as well as to reduce the presence of hotspots. In one instance the adjustment component 126 may include control software that is designed to send control signals to retune selected parameter(s) of the ion implanter in order to increase the beam height above a threshold in ion beam height. In some embodiments, the adjustment component and/or analysis component may thus be configured to perform a determination of the appropriate hardware/parameter to be adjusted based upon the location of the detector 500. Similarly, the control software may be designed to send control signals to retune selected parameter(s) of the ion implanter in order to decrease a hotspot, which may involve reducing the beam current gradient along the Y-direction, that is, the rate of change of beam current along the Y-direction. For example, if the detector 500 is located downstream of a focusing element, a control signal may be sent by the adjustment component to direct the focusing element to adjust its parameters to defocus the ion beam when a hotspot is determined. In some embodiments, multiple control signals may be sent to adjust respective parameters of multiple different ion implanter components. This multiple control signals may be sent in iterative or parallel fashion to the different ion implanter components in different implementations.

The detection of ion beam current, analysis of the ion beam properties, and adjustment to ion implanter parameters may be performed in series of closed beam adjustment loops until ion beam properties fall within an acceptable range. In one example each beam adjustment loop may include determining that the beam height of a detected ion beam is below a threshold, and sending a signal to adjust one or more parameters of an ion implanter based upon the detected beam height. In another example, each beam adjustment loop may include determining that the change in detected beam current as a function of position along a given direction (beam current gradient) is too large, followed by sending a signal to adjust one or more parameters of the ion implanter based upon the detected beam current gradient. For example, the voltage applied to a focusing electrode may be adjusted, the strength of a magnetic quadrupole lens may be changed or Z gap of a source manipulator adjusted.

In various embodiments, after detection of a hotspot, or that beam height is below a threshold, a number of beam adjustment loops may be performed to adjust ion beam properties. In some embodiments, the control system such as control system 104 may be configured to terminate an ion beam process after a given number of beam adjustment loops are performed if the ion beam height is too small or if a hotspot persists, for example. This may signal to an operator that the ion implantation apparatus is not able to automatically correct components to bring the ion beam current variation within a tolerable range, and that manual intervention is necessary. In one particular implementation, if, after a predetermined number of beam adjustment loops, a subsequently performed ion beam measurement indicates that the retuning of the selected parameter(s) does not produce the desired improvement in ion beam properties, the control system 104 may be configured to disable the ion beam from entering a wafer stage. For example, the control system 104 may send a control signal to an interlock that is enabled to stop wafer processing until the cause for the detected beam problem(s) is identified and rectified by other means.

Included herein is a set of flow charts representative of exemplary methodologies for performing novel aspects of the disclosed architecture. While, for purposes of simplicity of explanation, the one or more methodologies shown herein, for example, in the form of a flow chart or flow diagram, are shown and described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

Figure 6:
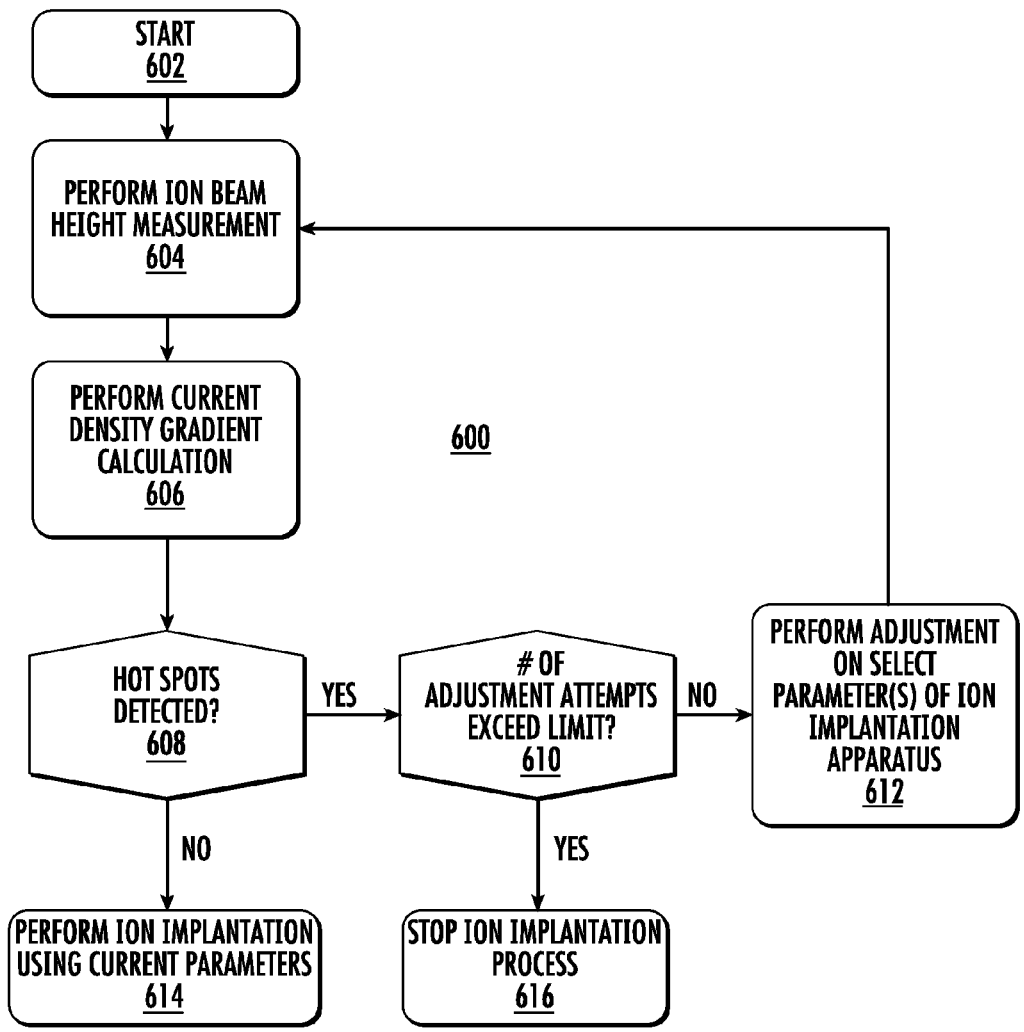
FIG. 6 shows a first exemplary logic flow.

FIG. 6 depicts a first exemplary flow 600 for control of beam current uniformity. At block 602 the flow starts. At block 604 a beam height measurement is performed. At block 606, a current density gradient calculation is performed for the detected ion beam. The current density gradient calculation may be based upon detected beam current along the same direction as that used to determine beam height. At block 608 a determination is made as to whether any hotspots are detected. A hotspot may correspond to an excess in the density gradient above a threshold. If no hotspots are detected, the flow proceeds to block 614 where ion implantation is performed using the current ion implanter parameters. If, at block 608, hotspots are detected the flow proceeds to block 610.

At block 610 a decision is made as to whether the number of beam adjustment attempts has exceeded a limit. If so, the flow proceeds to block 616 where the ion implantation process is halted. If the limit has not been exceeded the flow proceeds to block 612 where adjustment to a select parameter or parameters of the ion implantation apparatus are performed. The flow then returns to block 604.

Figure 7:
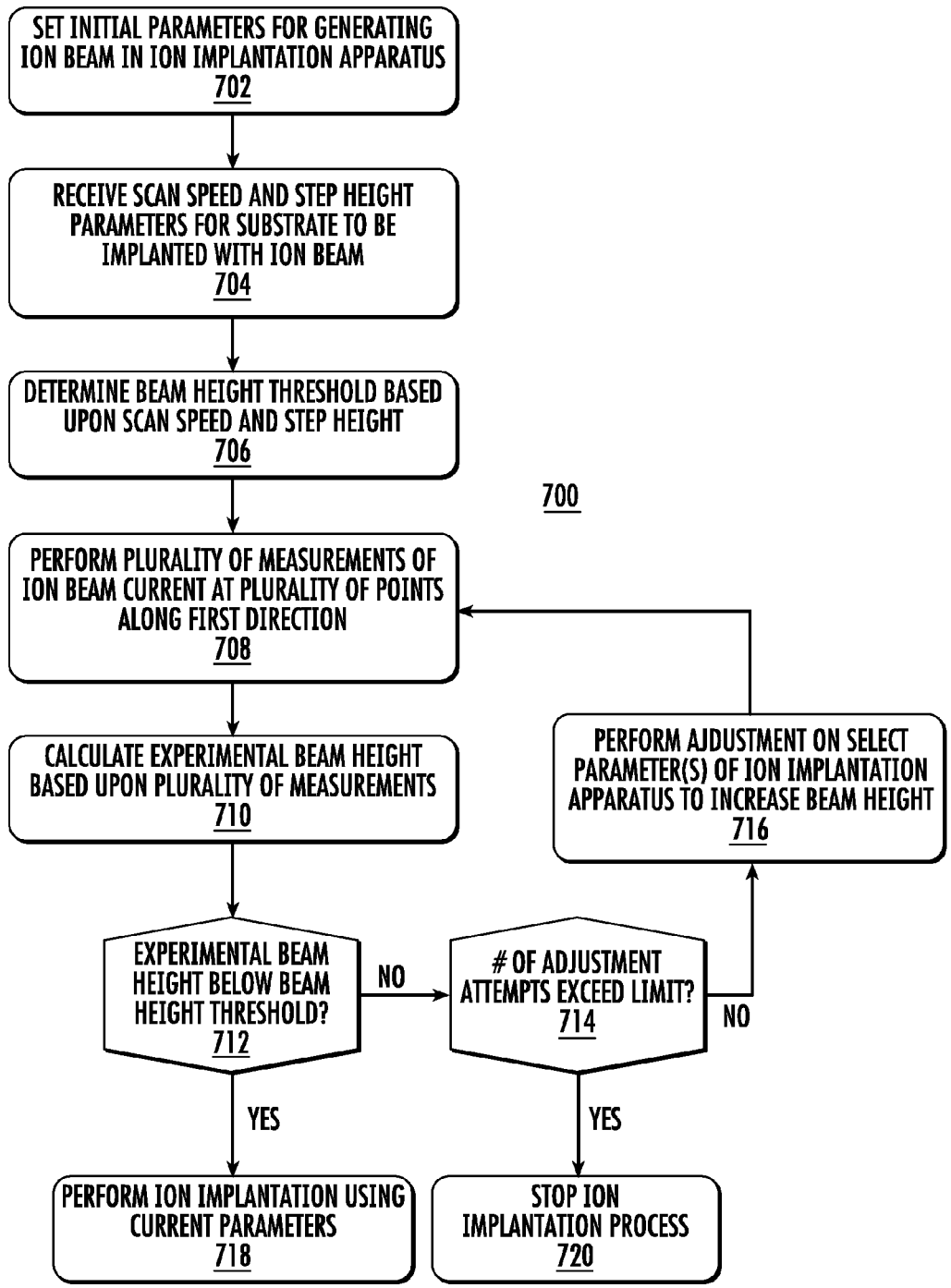
FIG. 7 shows a second exemplary logic flow.

FIG. 7 depicts a second exemplary flow 700 for control of beam current uniformity. At block 702 initial parameters are set for generating an ion beam in an ion implantation apparatus. At block 704, scan speed and step height parameters are received for a substrate stage to scan a substrate to be implanted with the ion beam. At block 706, a beam height threshold is determined for a substrate based upon the received scan speed and step height parameters. At block 708, a plurality of measurements of ion beam current are performed at a plurality of points along a first direction. At block 710 an experimental beam height is calculated based upon the plurality of measurements.

After block 710 the flow proceeds to block 712 where a determination is made as to whether the experimental beam height is below a beam height threshold. If not, the flow proceeds to block 718 where ion implantation is performed using the current parameters. If not, the flow proceeds to block 714 where a determination is made as to whether the number of beam adjustment attempts exceeds a limit. If so, the flow proceeds to block 720 where the ion implantation process is stopped. If not, the flow proceeds to block 716 where adjustment is performed on select parameter(s) of the ion implantation apparatus to increase beam height. The flow then returns to block 708.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system to control an ion beam in an ion implanter, comprising:
   a detector to perform a plurality of beam current measurements of the ion beam along a first direction perpendicular to a direction of propagation of the ion beam;
   an analysis component to determine a beam current profile based upon the plurality of beam current measurements, the beam current profile comprising a variation of beam current along the first direction, and to calculate a slope of the beam current profile and a beam height along a first direction based upon the beam current profile; and
   an adjustment component to adjust the beam height of the ion beam along the first direction when the beam current profile indicates the beam height is below a threshold, and to defocus the ion beam when a hotspot is determined.

2. The system of claim 1, wherein the detector comprises a multipixel detector that is configured to simultaneously record the plurality of beam current measurements for a respective plurality of different points along the first direction.

3. The system of claim 1, wherein the analysis component is configured to determine if a slope of the beam current profile exceeds a slope threshold indicative of an excessive beam current density.

4. The system of claim 3, wherein the analysis component is configured to terminate an ion implantation process when the presence of the hotspot is determined after a predetermined number of beam adjustment loops, wherein each beam adjustment loop comprises determining that beam height is below a beam height threshold and sending a signal to adjust a parameter of the ion implanter based upon the determined beam height.

5. The system of claim 1, further comprising a substrate scanner to scan a substrate along the first direction while exposed to the ion beam, wherein the analysis component is configured to determine the threshold based upon a scan speed and a step height of the substrate scanner.

6. An ion implanter, comprising:
   an ion source to generate an ion beam;
   a detector to perform a plurality of ion beam current measurements of the ion beam along a first direction perpendicular to a direction of propagation of the ion beam;
   a controller including at least one computer-readable storage medium comprising instructions that, when executed, cause the controller to:
   determine a beam current profile based upon the plurality of ion beam current measurements, the beam current profile comprising a variation of ion beam current along the first direction;
   calculate a beam height along the first direction based upon the beam current profile; and
   send instructions to perform a parameter adjustment to increase the ion beam height along the first direction when the calculated beam height is below a threshold, and to defocus the ion beam when a hotspot is determined.

7. The ion implanter of claim 6, wherein the detector comprises a multipixel detector that is configured to simultaneously record a plurality of beam current measurements for a respective plurality of different points along the first direction.

8. The ion implanter of claim 6, wherein the at least one computer-readable storage medium comprising instructions that, when executed, cause the controller to determine the presence of the hotspot in the ion beam based upon the beam current profile.

9. The ion implanter of claim 8, wherein the at least one computer-readable storage medium comprising instructions that, when executed, cause the controller to terminate an ion implantation process when the presence of the hotspot is determined after a predetermined number of beam adjustment loops, wherein each beam adjustment loop comprises determining that beam height is below a beam height threshold and sending a signal to adjust a parameter of the ion implanter based upon the determined beam height.

10. The ion implanter of claim 8, further comprising a substrate scanner to scan a substrate along the first direction while exposed to the ion beam, the at least one computer-readable storage medium comprising instructions that, when executed, cause the controller to determine the threshold based upon scan speed and step height of the substrate scanner.

11. An ion implanter, comprising:
    a detector to perform a plurality of ion beam current measurements of the ion beam along a first direction perpendicular to a direction of propagation of the ion beam;
    a controller including at least one computer-readable storage medium comprising instructions that, when executed, cause the controller to:
    determine a beam current profile based upon the plurality of ion beam current measurements, the beam current profile comprising a variation of ion beam current along the first direction;
    calculate an ion current gradient comprising change in ion current as a function of position along the first direction based upon the beam current profile; and send instructions to perform a beam adjustment comprising dynamically adjusting a parameter of the ion implantation apparatus when the ion current gradient is above a threshold, wherein the dynamically adjusting comprises defocusing the ion beam when the ion current gradient is above a threshold.

12. The ion implanter of claim 11, wherein the detector comprising a multipixel detector that is configured to simultaneously record a plurality of beam current measurements for a respective plurality of different points along the first direction.

13. The ion implanter of claim 11, wherein the at least one computer-readable storage medium comprising instructions that, when executed, cause the controller to terminate an ion implantation process when the ion current gradient is above a threshold after a predetermined number of beam adjustment loops, wherein each beam adjustment loop comprises determining the ion current gradient is above a threshold and sending a signal to adjust a parameter of the ion implanter based upon the determined beam height.

14. The ion implanter of claim 11, further comprising a substrate scanner to scan a substrate along the first direction while exposed to the ion beam.

* * * * *